United States Patent [19]

Chiu et al.

[11] Patent Number: 4,824,796

[45] Date of Patent: * Apr. 25, 1989

[54] PROCESS FOR MANUFACTURING SEMICONDUCTOR BICMOS DEVICE

[75] Inventors: Tzu-Yin Chiu; Gen M. Chin, both of Marlboro; Ronald C. Hanson, Middletown; Maureen Y. Lau, Keyport; Kwing F. Lee, Aberdeen; Mark D. Morris; Alexander M. Voshchenkov, both of Freehold; Avinoam Kornblit, Highland Park; Joseph Lebowitz, Watchung; William T. Lynch, Summit, all of N.J.

[73] Assignees: American Telephone and Telegraph Company, New York, N.Y.; AT&T Bell Laboratories, Murray Hill, N.J.

[*] Notice: The portion of the term of this patent subsequent to Apr. 18, 2006 has been disclaimed.

[21] Appl. No.: 77,953

[22] Filed: Jul. 10, 1987

Related U.S. Application Data

[63] Continuation of Ser. No. 854,885, Apr. 23, 1986, abandoned.

[51] Int. Cl.$^4$ .................. H01L 21/70; H01L 27/00
[52] U.S. Cl. .................................. 437/57; 437/31; 437/32; 437/33; 437/34; 437/50; 437/41; 437/186; 437/192; 148/DIG. 9; 148/DIG. 10; 148/DIG. 124; 357/43; 357/59; 156/643
[58] Field of Search .................. 437/41, 31, 40, 32, 437/34, 33, 50, 57, 58, 984, 241, 162, 186, 189, 191, 192, 190, 193, 195, 200; 357/34, 59 G, 42, 59 H, 43, 44; 156/643, 653, 657; 148/DIG. 9, DIG. 10, DIG. 11, DIG. 124

[56] References Cited

U.S. PATENT DOCUMENTS

| | | | |
|---|---|---|---|
| 4,157,269 | 6/1979 | Ning et al. | 29/577 R |
| 4,329,706 | 5/1982 | Crowder et al. | 29/571 |
| 4,419,810 | 12/1983 | Riseman | 29/576 B |
| 4,453,306 | 6/1984 | Lynch et al. | 437/201 |
| 4,455,738 | 6/1984 | Houston et al. | 29/571 |
| 4,484,388 | 11/1984 | Iwasaki | 29/576 W |
| 4,528,744 | 7/1985 | Shibata | 29/571 |
| 4,536,944 | 8/1985 | Bracco et al. | 29/571 |
| 4,536,945 | 8/1985 | Gray et al. | 29/571 |
| 4,577,392 | 3/1986 | Peterson | 29/571 |
| 4,584,055 | 4/1986 | Kaganuma et al. | 156/643 |
| 4,599,789 | 7/1986 | Gasner | 29/571 |
| 4,603,468 | 8/1986 | Lam | 437/164 |
| 4,604,790 | 8/1986 | Bonn | 357/43 |
| 4,621,412 | 11/1986 | Kobayashi et al. | 437/34 |

FOREIGN PATENT DOCUMENTS 0023146 7/1980 European Pat. Off. .
219612 12/1982 Japan .

OTHER PUBLICATIONS

Ghandhi, *VLSI Fabrication Principles*, John Wiley & Sons, N.Y., pp. 582–585, 1983.

*Primary Examiner*—Brian E. Hearn
*Assistant Examiner*—Mary Wilczewski
*Attorney, Agent, or Firm*—Daniel D. Dubosky; Gregory C. Ranieri

[57] ABSTRACT

A process for creating bipolar and CMOS transistors on a p-type silicon substrate is disclosed. The silicon substrate has typical n+ buried wells and field oxide regions to isolate the individual transistor devices. In accordance with the process, stacks of material are created over the gate elements of the CMOS devices and over the emitter elements of the bipolar transistors. The stacks of material over the gate elements have a silicon dioxide gate layer in contact with the epitaxial layer of the substrate, and the stacks of material over the emitter elements have a polycrystalline silicon layer in contact with the epitaxial layer. Walls of silicon dioxide are created around the stacks in order to insulate the material within the stacks from the material deposited outside of the walls. Polycrystalline silicon in contact with the epitaxial layer is deposited outside the walls surrounding the stacks. All polycrystalline silicon layers in contact with the epitaxial layer are implanted with appropriate dopants such that these layers serve as reservoirs of dopant in order to simultaneously create the source and drain elements of the CMOS devices and the emitter elements of the bipolar devices during a heating step in the process. A tungsten layer is deposited over the polycrystalline layer in order to provide a conductive coupling to aluminum electrodes.

8 Claims, 7 Drawing Sheets

PROCESS FOR MANUFACTURING SEMICONDUCTOR BICMOS DEVICE

This application is a continuation of application Ser. No. 854,885, filed Apr. 23, 1986, abandoned.

BACKGROUND OF THE INVENTION

This invention relates to semiconductor processing and more particularly to a semiconductor process that can produce bipolar and field effect transistors on the same chip.

Several BICMOS processes have been disclosed in the prior art which can result in a combination of bipolar and field effect transistors on the same semiconductor device. Examples of these prior art processes can be found in U.S. Pat. No. 4,536,945 issued Aug. 27, 1985 to G. Bruce et al. and U.S. Pat. No. 4,484,388 issued Nov. 27, 1984 to I. Hiroshi. Both of these prior art processes have been found to be limited in producing very high-speed semiconductor devices. In both of the processes the gate structure itself is used as an alignment mechanism in determining the position of the contacts that are made to the active elements of the device. In both processes the metallic contacts are made directly to the source and drain regions. The dimension of these regions is dependent upon the precision with which a hole can be placed with respect to the gate structure. This fact causes the source and drain regions to be larger than desirable, thereby causing these regions to have a larger parasitic capacitance than desirable which in turn limits high-speed operation.

In addition, the p-region that is established in these processes for the PMOS device is created by implanting boron directly into the semiconductor material. As is well-known in the art, the boron cannot be doped too heavily since it tends to channel quite readily through the crystalline structure of the semiconductor material during implanatation thereby causing a larger junction depth than desired. On the other hand, a light doping of boron produces an element of the semiconductor device which has a higher resistance than desirable.

SUMMARY OF THE INVENTION

The dimensional size of the source and drain and base regions is reduced in accordance with the present invention wherein stacks of appropriate materials are created over the areas of the substrate corresponding to the gate elements of the field effect transistors and the emitter elements of the bipolar transistors that are to be created in the resulting devices. An insulating layer is deposited over the entire wafer including the stacks. This layer is then reactive ion etched such that the insulating layer remains only as walls around the stacks. A polycrystalline layer is then deposited over the entire wafer including the walls and the stacks. Portions of this polycrystalline layer are then removed outside of the areas that define the individual transistor devices thereby creating islands of isolated polycrystalline silicon material where appropriate. Appropriate dopants are then deposited into these islands of polycrystalline silicon material to create reservoirs of dopant materials, and the doped island are then etched back to the point where the walls around the stacks form insulating boundaries between the material within the walls and polycrystalline silicon material outside the walls. The wafer is then heated so as to drive the dopants from the polycrystalline silicon material into the substrate wherever the polycrystalline silicon material is in contact with the substrate. A low resistance material is then selectively deposited over the polycrystalline silicon material so as to establish contact with the elements of the individual transistors.

DETAILED DESCRIPTION

Figure 1:
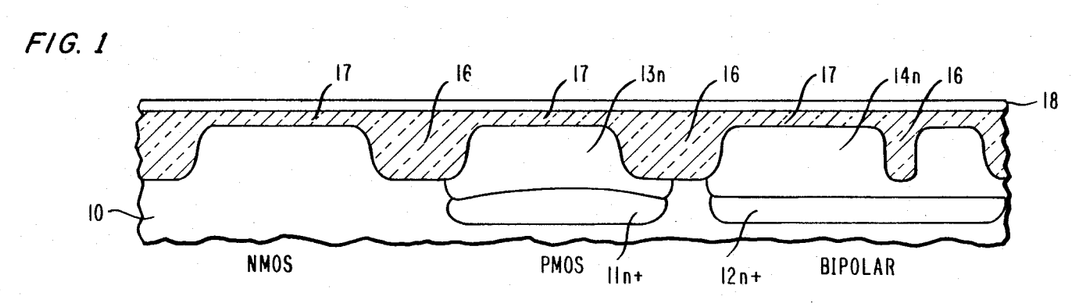
FIGS. 1 through 14 are sectional views of a semiconductor wafer that are useful in explaining the process to be described hereinafter for manufacturing a BICMOS structure.

Techniques well-known to those in the semiconductor processing art are used to create a semiconductor wafer having a cross-section of the type illustrated in FIG. 1. In brief, a p-type semiconductor silicon substrate is cleaned, and an oxide layer is deposited thereon which layer is etched in accordance with a mask to define those n+ regions designated as 11 and 12 in FIG. 1. Arsenic is then implanted into these regions and driven into the wafer structure to create the n+ buried wells 11 and 12 in FIG. 1. After an oxide strip a p-type epitaxial layer of about 1 μm is then grown over the wafer having the n+ buried well structures. The areas corresponding to n wells 13 and 14 in FIG. 1 are defined using a mask and a photolithography process step and then the wells are created by driving in a phosphorus implant. A pad oxide growth and nitride deposition is then created over the entire wafer structure followed by a lithographic step which defines all of the active areas corresponding to the NMOS, PMOS and bipolar devices that are to be created during the following steps.

The areas in between the devices corresponding to the field isolation regions 16 in FIG. 1 can then be selectively etched and filled in with a field oxide growth thereby isolating the active elements. The next mask can then be used to block out the wells corresponding to the PMOS and bipolar devices, and the NMOS device is exposed to a doubly ionized boron implant in order to isolate the NMOS device. Removal of the pad oxide and nitride stacks can then be performed, followed by a sacrificial oxide growth which is removed followed by a gate oxide growth of about 200 angstroms, thereby creating the oxide regions 17 in FIG. 1. Finally, a deposition of polycrystalline silicon (POLY) material is created over the entire wafer in order to fabricate layer 18 in FIG. 1, which layer has a dimension of about 50 nm. All of these processing steps described thus far are well-known to those skilled in the silicon semiconductor processing art and are similar to those that have been described in prior art patents relating to this technology.

Figure 2:
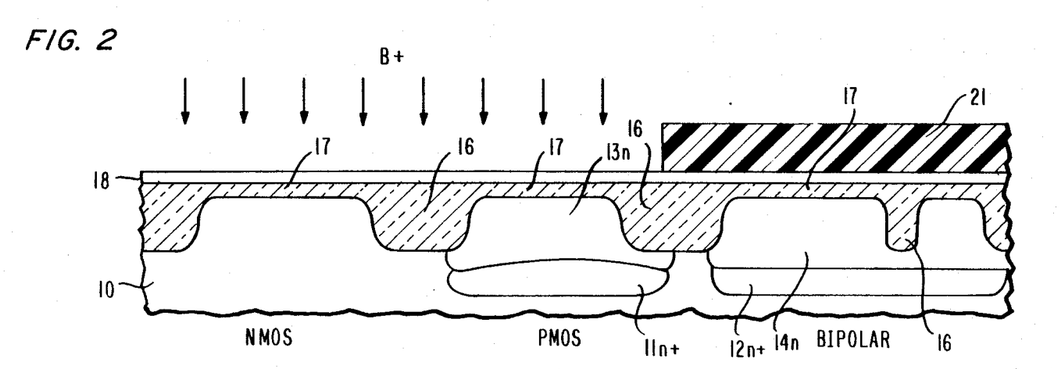
Figure 3:
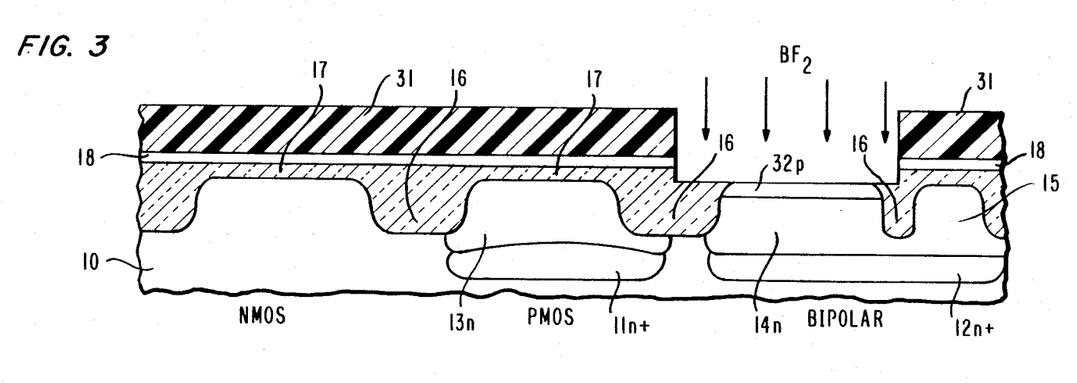

After creating the wafer with a cross-sectional structure of the type illustrated in FIG. 1, a lithography technique is used to establish a photoresist layer 21 in FIG. 2 over the bipolar active elements on the wafer thereby blocking them from subsequent implantation of the dopant. Ionized boron, B+, is then implanted at a dose of about $8 \times 10^{11}$ to $2 \times 10^{12}$ atoms/cm$^2$ with an energy of 30 to 100 KeV. As a result a threshold implant is established for the MOS devices on the wafer. The photoresist layer 21 is then stripped from the wafer, and the next photolithography step is then used to create another photoresist layer 31 over the areas of the wafer corresponding to the MOS devices as indicated in FIG. 3. The polycrystalline silicon layer covering the bipolar devices is etched, and a wet oxide etch of BHF is used to remove the gate oxide layer over the bipolar devices, thereby exposing the n-type layer corresponding to the area 14 of the substrate.

Figure 4:
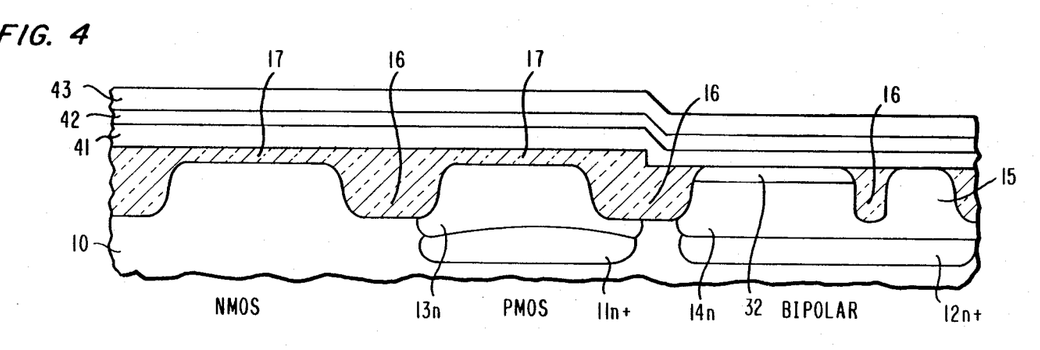

A boron fluoride, BF$_2$, implant can then be made at a dopant level of 1 to $5 \times 10^{13}$ atoms/cm$^2$ and an energy of 25 to 50 KeV in order to create a p-type layer 32 which will eventually serve as the base of the bipolar device. The photoresist layer 31 is then stripped from the wafer and a polycrystalline silicon layer of 350 nm is then deposited over the entire wafer. This polycrystalline silicon layer not only creates a new polycrystalline layer 41 (shown in FIG. 4) over the bipolar devices but also increases the size of the polycrystalline silicon layer size already present over the MOS devices. This entire polycrystalline silicon layer is then implanted with an arsenic dopant having a dosage of $1 \times 10^{16}$ atoms/cm$^2$ at an energy of about 40 KeV. As a result, the entire polycrystalline silicon layer 41 is embedded with an n-type dopant. This dopant reservoir in layer 41 will subsequently serve as the source of dopant material for the creation of an emitter over the base layer 32 of the bipolar device. A silicon nitride layer 42 is then deposited with a thickness of about 50 to 100 nm over the entire wafer, and a polycrystalline silicon layer 43 is also deposited over the entire wafer with a thickness of about 600 nm.

Figure 5:
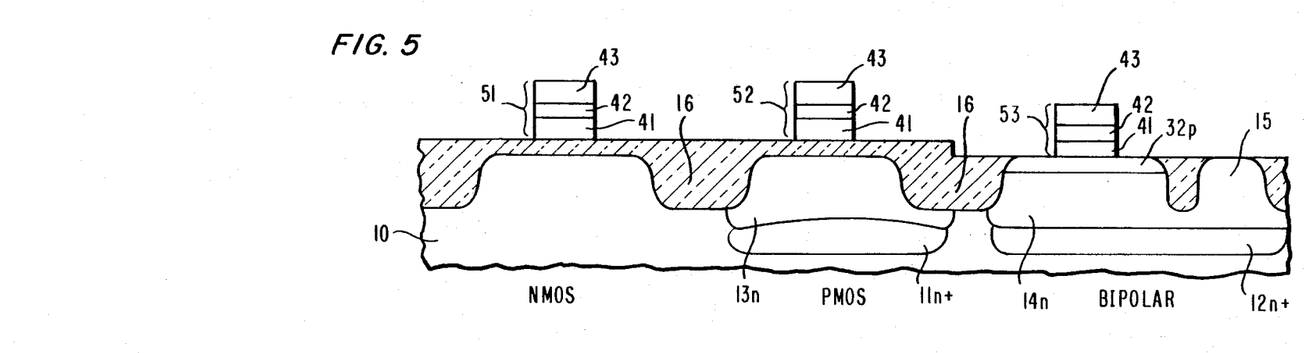

The next photolithography is then used to define those portions of the wafer corresponding to the stacks of material designated in FIG. 5 by the numerals 51, 52 and 53. Following this photoresist masking, the entire wafer is subjected to a reactive ion etching to remove the polycrystalline silicon and nitride layers not protected by the photoresist material. After the photoresist material is removed, the structure which results is shown in FIG. 5 of the drawings. These stack formations indicated in FIG. 5 by the numerals 51, 52 and 53 are positioned over those areas of the wafer which will eventually correspond to the gate electrodes of the MOS devices and the emitter electrode of the bipolar devices.

Figure 6:
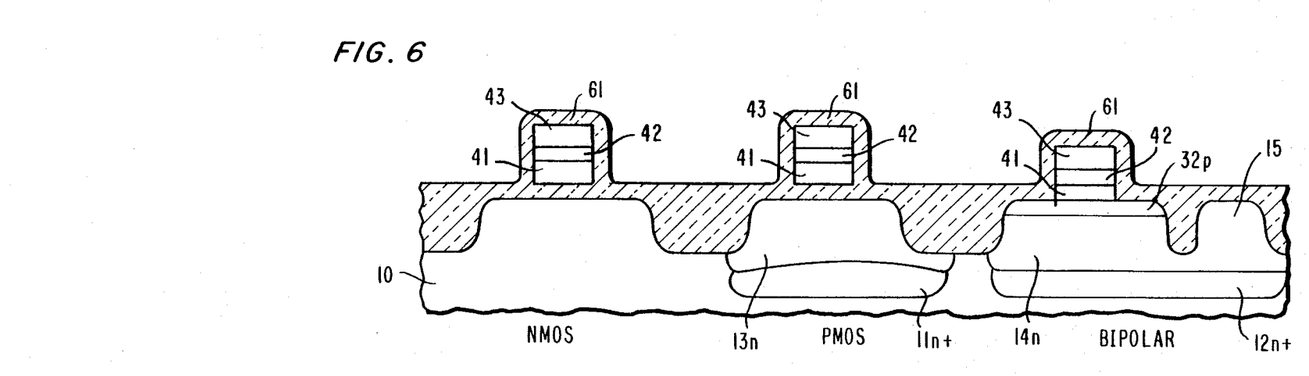
Figure 7:
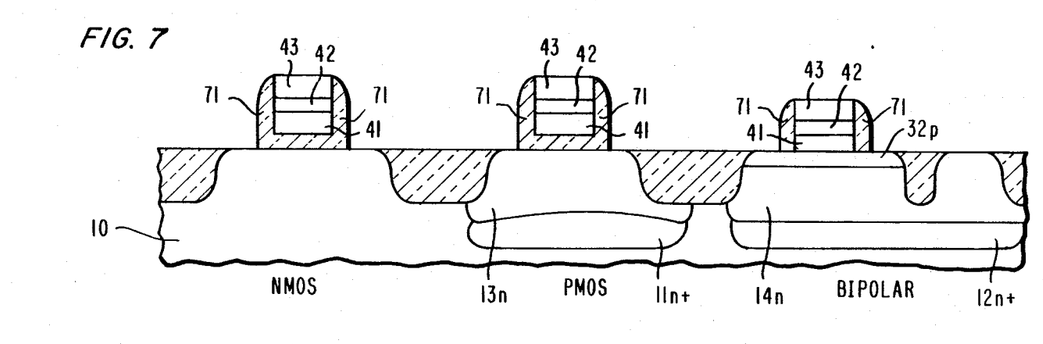

A conformal oxide 61 which will serve as the sidewall oxide is then deposited over the entire wafer to a thickness of about 200 nm as indicated in FIG. 6. An anisotropic reactive ion etching process is then used to remove portions of the oxide. This reactive ion etching process removes all of the oxide which was deposited over the tops of the stacks 51, 52 and 53 and all of the oxide between the walls of oxide adjacent to the stacks thereby resulting in silicon dioxide walls 71 surrounding the stacks as indicated in FIG. 7. This sidewall formation results due to the highly directional nature of the reactive ion etching process.

Figure 8:
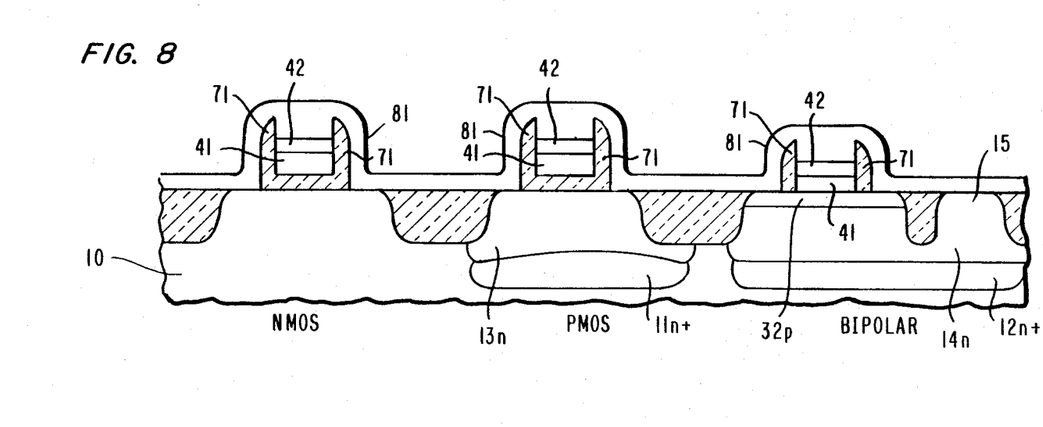

The wafer is then cleaned and a polycrystalline silicon layer 81 having a thickness of 200 nm is deposited over the entire wafer as shown in FIG. 8. A photolithography process is used to define the polycrystalline layer between active devices. The polycrystalline silicon is etched isotropically so that individual devices are isolated.

Figure 9:
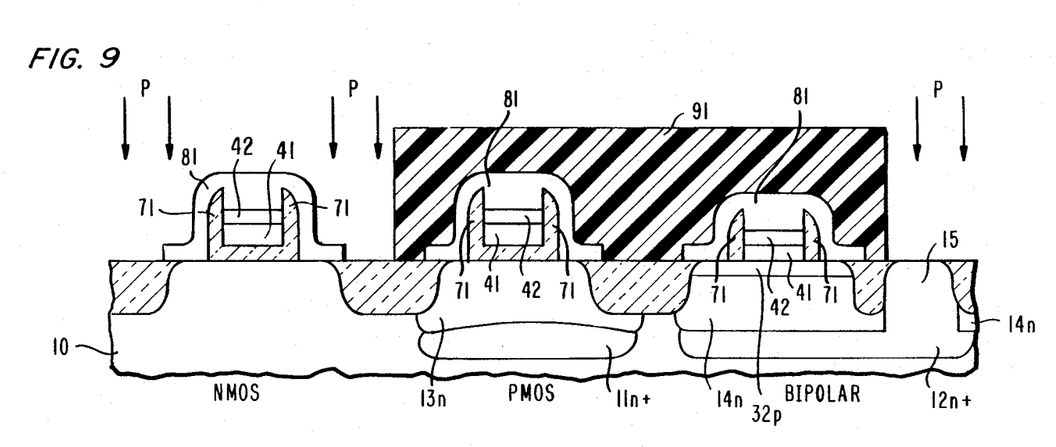

As indicated in FIG. 9, the next photolithography step defines photoresist layer 91 which covers the PMOS and bipolar devices thereby permitting the polycrystalline silicon layer covering the NMOS devices and the collector region 15 of the bipolar device to be implanted with a phosphorus ion implant. This phosphorus ion implant is delivered at a dose of 1 to $5 \times 10^{15}$ atoms/cm$^2$ and an energy of 25 to 75 KeV to create an n+ doping of the polycrystalline layers covering the collection region 15 and the NMOS device areas. Photoresist layer 91 positioned over the PMOS and bipolar devices is then stripped.

Figure 10:
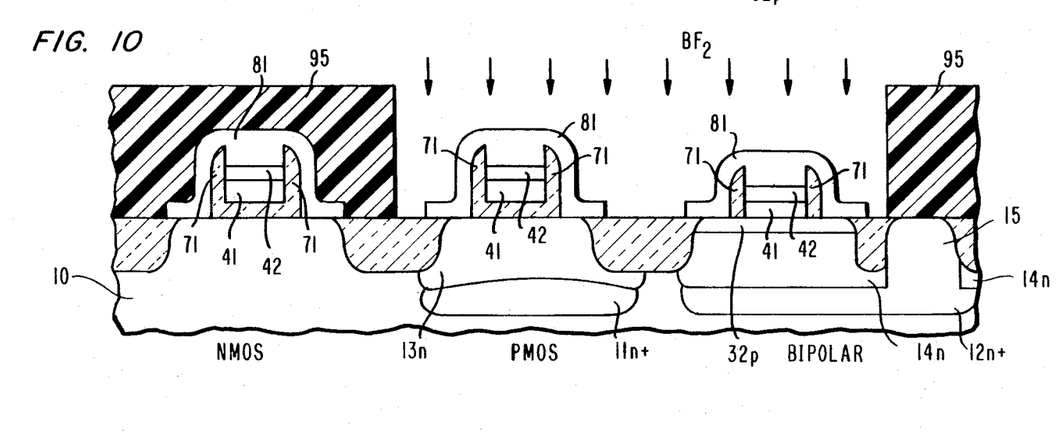

The next photolithography step is then used to establish a photoresist layer over the NMOS active devices and the collector region 15 thereby establishing a photoresist layer 95 in FIG. 10 which is the complement of the one shown as 91 in FIG. 9. The PMOS and bipolar devices are then exposed to a boron fluoride BF$_2$ ion implant having a dosage of 1 to $10 \times 10^{15}$ atoms/cm$^2$ and an energy of 25 to 35 KeV as shown in FIG. 10. This BF$_2$ implant causes the polycrystalline material covering the PMOS and parts of the bipolar devices to achieve p+ type doping. The photoresist is then removed.

The entire wafer is then covered with a silicon nitride deposition having a thickness of about 80 nm. This layer of silicon nitride is designated as 102 in FIG. 11. This silicon nitride deposition will protect the polycrystalline silicon in a subsequent step during which a photoresist layer is selectively etched back.

Figure 11:
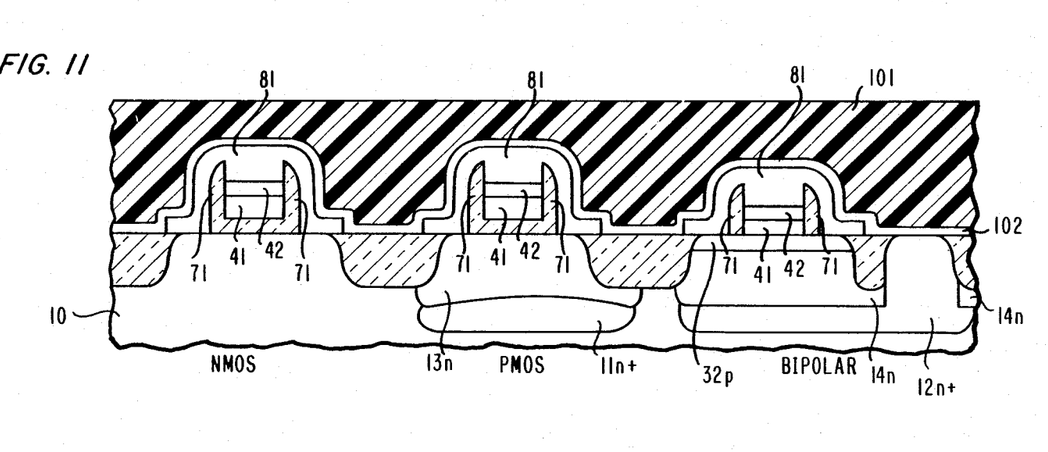

The next step in the process requires that a planarizing photoresist material with a uniform thickness of 3 to 5 $\mu$m be applied to the entire wafer, resulting in photoresist layer 101 in FIG. 11. This photoresist layer 101 is then etched back to a point where the tops of the stacks 51, 52 and 53 are clearly exposed. The cross-sectional view of the wafer is not as yet shown in FIG. 12 since the nitride layer and polycrystalline silicon layer are still covering the tops of the silicon dioxide walls. At this point, the exposed silicon nitride is removed by using a reactive ion etching process which results in the removal of about 80 nm of material. The remaining photoresist material is then hardened and the exposed polycrystalline material is etched back. The remaining photoresist material is then removed.

Figure 12:
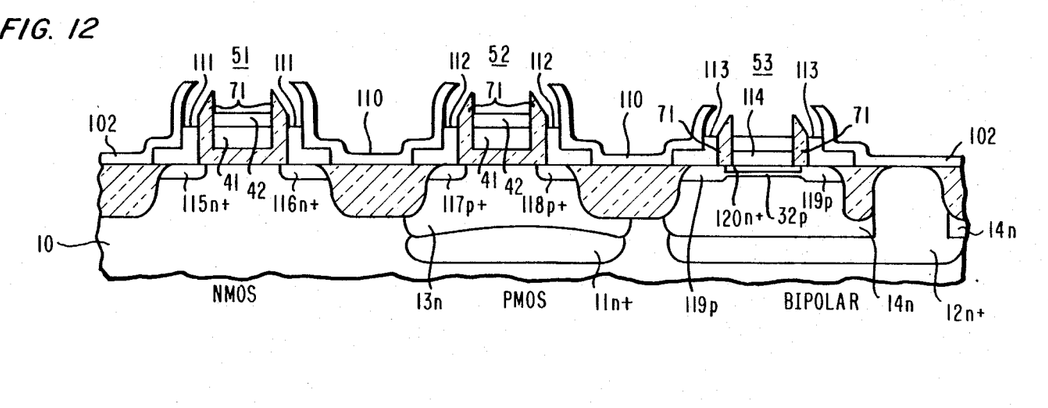

The critical areas of polycrystalline material which remain are those shown and designated in FIG. 12 as areas 111, 112, 113 and 114. Areas 111 of polycrystalline material surrounding the silicon dioxide walls for the NMOS device were previously exposed in the step corresponding to FIG. 9 to a dopant of phosphorus ions thereby resulting in a reservoir of n-type dopant in this polycrystalline material. Areas 112 and 113 of polycrystalline material surround the silicon dioxide walls corresponding to the PMOS and bipolar devices. These areas of polycrystalline material were implanted in the step corresponding to the PMOS and bipolar devices. These areas of polycrystalline material were implanted in the step corresponding to FIG. 10 with a boron fluoride dopant, thereby making these areas reservoirs of p-type material. In addition, the polycrystalline material designated as area 114 in the cross-section shown in FIG. 12 is what remains from the polycrystalline silicon which was deposited as layer 41 in FIG. 4 and implanted with arsenic so as to create a reservoir of n-type material. At this point in the process the entire wafer is heated to a temperature of about 950 degrees Centigrade for about 60 minutes in order to cause these reservoirs of implanted dopants to diffuse into the silicon substrate thereby creating source and drain regions 115, 116, 117 and 118, the extrinsic base region 119, and a region 120 under stack 53 of the bipolar device, thereby creating an emitter base junction between it and the p-type base region 32 previously created.

Figure 13:
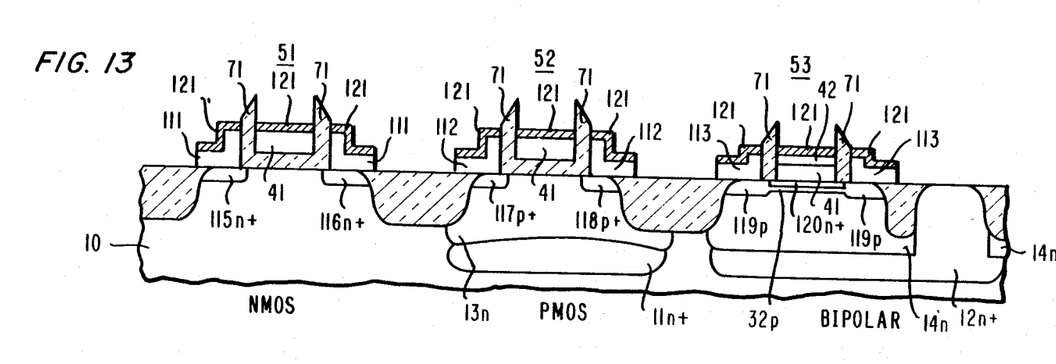

A wet etch of phosphoric acid at 155 degrees in a reflux system is then performed to remove the remaining silicon nitride over the entire wafer. The wafer is then subjected to a selective deposit of tungsten or to a self-aligned silicide reaction thereby creating a conductive deposit 121 having a thickness of about 100 nm over all of the exposed areas of polycrystalline silicon as shown in FIG. 13. The protruding oxide wall structures improve the selective process so that no conductive material will form or remain over the areas of silicon dioxide. The entire wafer can then be annealed in order to reduce the resistivity of the conductive material. The high oxide wall protruding above the gate surface is removed using a wet oxide etch.

Figure 14:
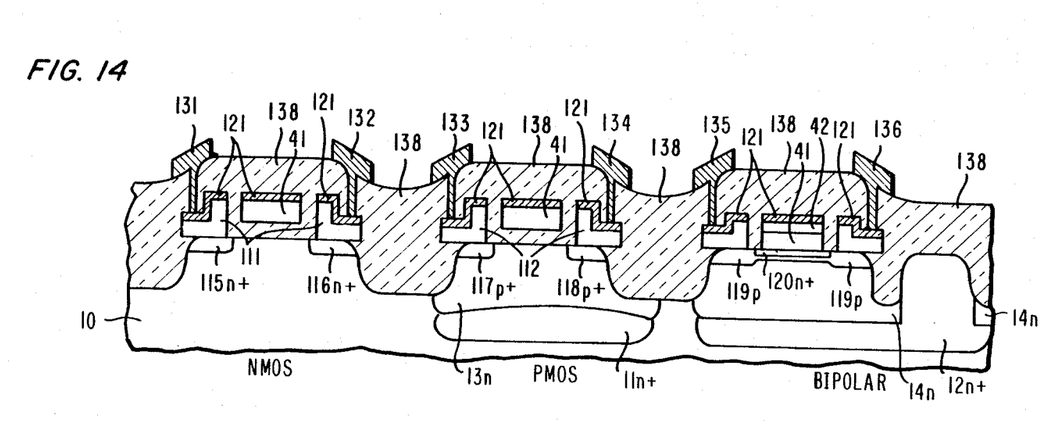

After cleaning the entire wafer, a CVD deposition creates a layer of silicon dioxide 138 over the entire wafer as shown in FIG. 14, thereby joining the silicon dioxide walls with the field oxides that separate the individual elements of the device. This silicon dioxide layer has a thickness of about 400 nm. Using a photolithography process and a mask that defines the positions of the holes that are to be created in this silicon dioxide layer to make contact to the previously deposited conductive materials, a combination of a wet etch and reactive ion etch can be used to create the holes through the silicon dioxide 138 down to the level of the tungsten or silicide deposit. The photoresist material used during the lithography step is then removed. Finally, aluminum is deposited and patterned to form the electrodes shown as 131 through 136 in FIG. 14. Contact to the emitter and collector elements of the bipolar device can be made in a similar fashion in a plane not shown in the FIG. 14 cross-section. The wafer is then heated in a final sintering step.

What has been described hereinabove is a specific embodiment of the present invention. Numerous departures may be made by those skilled in the art without departing from the spirit and scope of the present invention. For example, the inventive process is equally applicable to a semiconductor wafer wherein only field effect transistors are created. In this case, the stacks of semiconductor material are positioned over the gate structures only and the steps necessary for the processing of the bipolar devices may be eliminated. The self-aligned polysilicon contact still results in lowering the source and drain capacitance of the field effect transistors that are much closer than the spacing that can be achieved in prior art processes. Similarly, the process may be applicable to bipolar devices alone and the emitter-base structure created by the process is again lower capacitance and resistance, and therefore capable of operating at higher speeds, than the devices produced in prior art processes.

What is claimed is:

1. In a process for creating transistor devices in selected areas of a semiconductor wafer wherein stacks of appropriate materials have been created over predetermined portions of the selected areas corresponding to elements of the transistors, a method of creating an insulating boundary between elements of said devices created in the wafer under said stacks and elements of said devices in the wafer adjacent to said stacks comprising the steps of depositing an insulating layer over the entire wafer including the stacks, directionally selective etching said insulating layer such that the insulating layer remains only as walls around the stacks, depositing a semiconductor material over the wafer including the walls and stacks, said semiconductor material having the property that it can be doped to become conductive where appropriate, and etching the semiconductor material back to the point where the walls form protruding insulating boundaries between the semiconductor material within the walls and outside of the walls.

2. In a process for creating transistor devices in selected areas of a semiconductor wafer wherein stacks of appropriate materials have been created over predetermined portions of the selected areas corresponding to elements of the transistors, the steps comprising depositing an insulating layer over the entire wafer including the stacks, directionally selective etching said insulating layer such that the insulating layer remains only as walls around the stacks, depositing a polycrystalline silicon layer over the wafer including the walls and stacks, removing the polycrystalline layer outside of the areas that define the individual transistors thereby creating islands of isolated polycrystalline silicon material, depositing appropriate dopants into the islands of polycrystalline silicon material, etching the doped islands of polycrystalline silicon material back to the point where the oxide walls form protruding insulating boundaries between the polycrystalline silicon material within the walls and outside of the walls, heating the wafer so as to drive the dopants from the polycrystalline silicon material into the substrate where the polycrystalline silicon material is in contact with said substrate, and selectively depositing a low resistance material over the polycrystalline silicon material so as to establish contact with elements of the individual transistors.

3. In a process as defined in claim 2 wherein the transistor devices include both NMOS and PMOS devices and the step of depositing appropriate dopants into the islands of polycrystalline silicon material comprises the following steps: masking the areas of the semiconductor wafer corresponding to the NMOS devices, depositing a p-type implant into the polycrystalline silicon covering the areas corresponding to the PMOS devices, masking the areas of the semiconductor wafer corresponding to the PMOS devices, and depositing an n-type implant into the polycrystalline silicon covering the areas corresponding to the NMOS devices.

4. A method of fabricating an insulating boundary region between at least one predetermined element of a transistor device formed in a selected area of a semiconductor substrate and transistor device elements adjacent thereto, said method comprising the steps of:
   forming a multi-layer electrode structure over at least a predetermined region of said semiconductor substrate, said predetermined region corresponding to said predetermined elements, said multi-layer electrode structure including a first layer comprising conductive material and a second layer above said first layer, said second layer comprising insulating material,
   forming a third layer comprising insulating material along the sides of at least said first layer,
   forming a fourth layer comprising conductive material over at least said electrode structure and regions substantially adjacent thereto, and
   etching said fourth layer back to the point where said third layer protrudes through said fourth layer forming an insulating boundary between said multi-layer electrode structure and remaining portions of said fourth layer.

5. The method as defined in claim 4 wherein said conductive material comprises polycrystalline silicon.

6. The method as defined in claim 4 further comprising the step of depositing a layer of planarizing photoresist material over said fourth layer prior to said reducing step.

7. The method as defined in claim 4 wherein the step of etching includes etching the fourth layer to expose said second layer.

8. The method as defined in claim 7 wherein said conductive material comprises polycrystalline silicon.

* * * * *